US009932667B2

(12) United States Patent
Shin et al.

(10) Patent No.: US 9,932,667 B2
(45) Date of Patent: Apr. 3, 2018

(54) NON-CONTINUOUS BONDING OF SPUTTERING TARGET TO BACKING MATERIAL

(75) Inventors: Jong-Won Shin, Nendeln (LI); Nikolaus Margadant, Maienfeld (CH); Klaus Leitner, Feldkirch (AT)

(73) Assignee: VITAL THIN FILM MATERIALS (GUANGDONG) CO., LTD., Qingyuan, Guangdong Province (CN)

( * ) Notice: Subject to any disclaimer, the term of this patent is extended or adjusted under 35 U.S.C. 154(b) by 1389 days.

(21) Appl. No.: 13/699,311

(22) PCT Filed: May 23, 2011

(86) PCT No.: PCT/EP2011/058335
§ 371 (c)(1),
(2), (4) Date: Feb. 1, 2013

(87) PCT Pub. No.: WO2011/144759
PCT Pub. Date: Nov. 24, 2011

(65) Prior Publication Data
US 2013/0118898 A1 May 16, 2013

Related U.S. Application Data

(60) Provisional application No. 61/344,131, filed on May 28, 2010.

(30) Foreign Application Priority Data

May 21, 2010 (EP) .................................... 10005319

(51) Int. Cl.
*C23C 14/34* (2006.01)
(52) U.S. Cl.
CPC ...... *C23C 14/3414* (2013.01); *C23C 14/3407* (2013.01)

(58) Field of Classification Search
CPC ..................... C23C 14/3407; C23C 14/3414
USPC ............ 204/298.12, 298.13, 298.21, 298.22
See application file for complete search history.

(56) References Cited

U.S. PATENT DOCUMENTS 5,282,943 A * 2/1994 Lannutti .............. B23K 35/005
204/192.12
5,836,506 A * 11/1998 Hunt .................... B23K 20/023
204/298.12

(Continued)

FOREIGN PATENT DOCUMENTS

| CN | 101543924 | 9/2009 |
| CN | 101648307 | 2/2010 |

(Continued)

OTHER PUBLICATIONS

Translation of the Office Action for TW Application No. 100114292 dated Dec. 30, 2014 and Search Report dated Nov. 29, 2014. (10 pages).

(Continued)

*Primary Examiner* — Rodney G McDonald
(74) *Attorney, Agent, or Firm* — Smith, Gambrell & Russell, LLP

(57) ABSTRACT

A target assembly comprising—a support body having a carrying surface; —a sputtering target having an attaching surface, said carrying surface and said attaching surface being arranged in opposing facing relation to one another, thereby defining an intermediate space between said carrying surface and said attaching surface; and—a bonding material disposed in the intermediate space for binding said attaching surface to said carrying surface, —wherein distinct areas of one or both of said attaching surface and said carrying surface are selectively, superficially treated to enhance the bonding strength of said bonding material in said distinct areas.

34 Claims, 4 Drawing Sheets

(56) References Cited

U.S. PATENT DOCUMENTS

| | | | | |
|---|---|---|---|---|
| 5,857,611 A | * | 1/1999 | Gilman | C23C 14/3407 204/298.12 |
| 2004/0079634 A1 | * | 4/2004 | Wickersham, Jr. | B21K 25/00 204/298.12 |
| 2005/0016833 A1 | * | 1/2005 | Lynn | C23C 14/3407 204/192.12 |
| 2005/0061857 A1 | * | 3/2005 | Hunt | B23K 3/047 228/245 |
| 2009/0152108 A1 | | 6/2009 | Huttl et al. | |
| 2009/0250337 A1 | | 10/2009 | Simons et al. | |

FOREIGN PATENT DOCUMENTS

| | | | |
|---|---|---|---|
| JP | 64-47864 | | 2/1989 |
| JP | S64-47864 | | 2/1989 |
| JP | 02-008364 | * | 1/1990 |
| JP | 3-111564 | | 5/1991 |
| JP | 2010-070842 | | 4/2010 |
| TW | 200833857 | | 8/2008 |
| TW | I-404813 | | 8/2013 |
| TW | I 404813 | | 8/2013 |

OTHER PUBLICATIONS

International Search Report for PCT/EP2011/058335 dated Aug. 17, 2011 (in English).
Communication from the Examining Division for European Patent Application No. 11 721 034.4 dated Aug. 19, 2015. (5 pages).
International Preliminary Report on Patentability for PCT/EP2011/058335 dated Nov. 27, 2012 (7 pages).

* cited by examiner

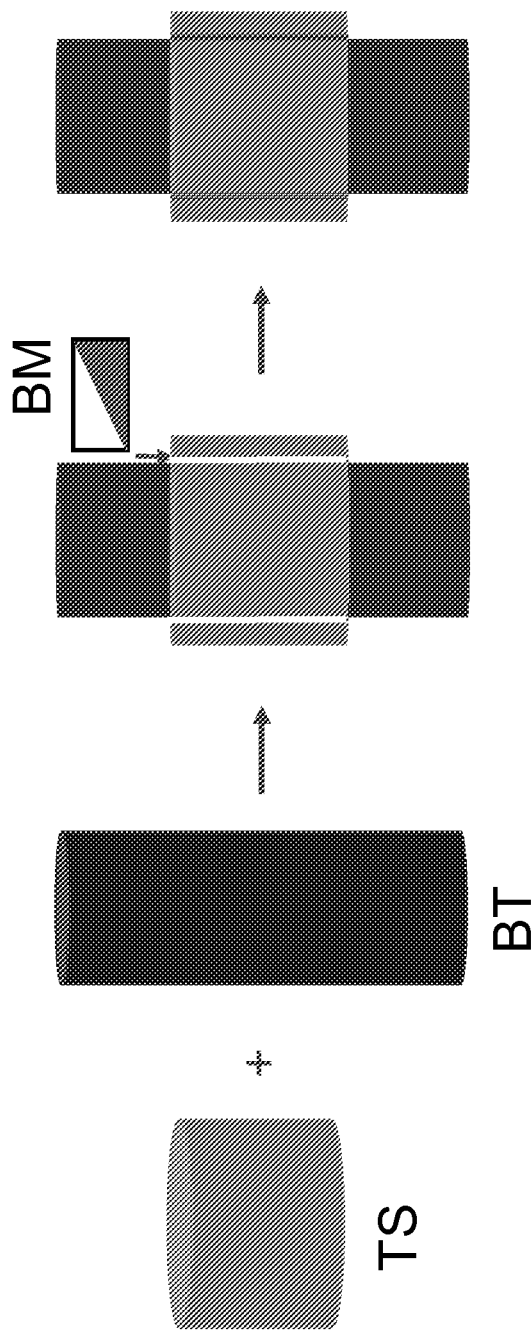
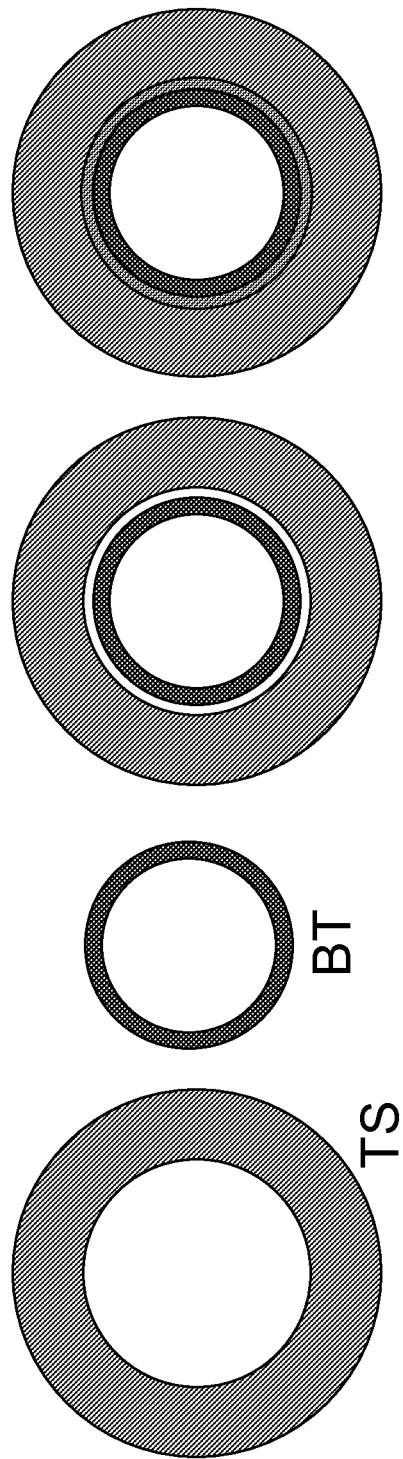
Fig. 1a
Fig. 1b

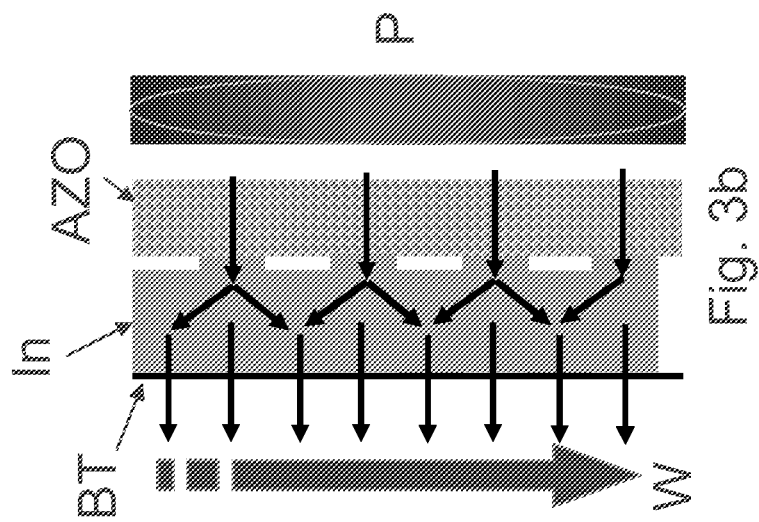
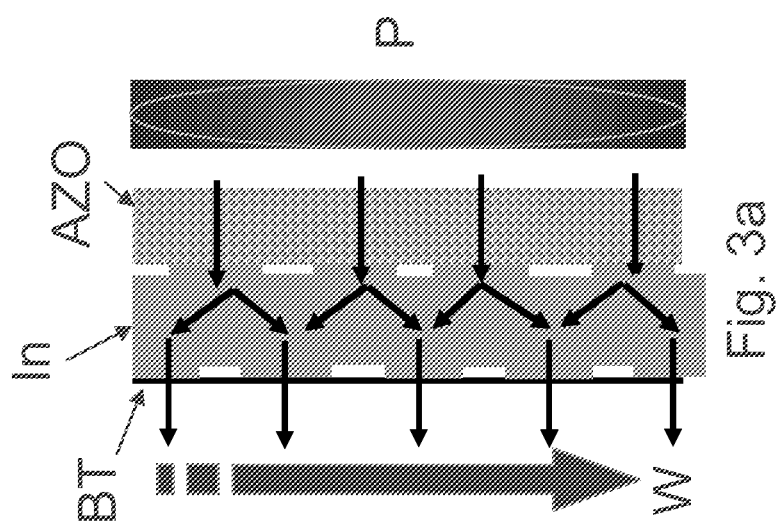

NON-CONTINUOUS BONDING OF SPUTTERING TARGET TO BACKING MATERIAL

TECHNICAL FIELD AND BACKGROUND

This invention relates to sputtering targets for thin film products. Such targets can be planar or cylindrical, and have a backing body in the form of a plate or tube—the so-called support—to which the ceramic or metallic target material is bonded.

During sputtering, targets are exposed to ion bombardment and by consequence high thermal loads, and the backing body is therefore water-cooled. Large sputtering targets generally consist of a backing tube or backing plate on which one or more target segments are bonded, i.e. they are attached to the backing body by a bonding material which can be a metal—or metal alloy—having a low melting temperature, also called a metallic solder, or any other kind of electrically and thermally conductive adhesive, such as a filled elastomer.

The function of the support is to provide for electrical power transfer, mechanical strength, and heat transfer to the cooling water, and it allows the target to be mounted in the sputtering source. As the target segments—in the form of plates or cylinders—are often bonded on the support by soldering, there is in most cases a mismatch in coefficients of thermal expansion between the target material and the support materials, which results in thermal stresses on the solder layer and on the interfaces between target segment and solder as well as between solder and backing body, especially during cooling down after bonding or soldering of the target, but also during usage of the target in the sputtering process. In addition there can be a volume contraction of the solder when it solidifies, which also leads to interface contraction stress.

The cumulative thermal and contraction stress often leads to strong and uncontrolled delamination of the solder layer from either the backing body or the target segment material or from both. Where delamination over larger surface areas occurs, heat dissipation from the target segment to the support is minimal, which leads to local overheating, provoking more uneven thermal stress and eventually cracking of the target segments during sputtering.

In an attempt to overcome the problem cited before, in US2009/0152108 the adhesive bonding of target to backing body is replaced by a plastically deformable compensation means that compensate for the deformation of both target and backing material. In one embodiment, the compensation means are formed by locally limited solder bridges partially connecting the target and the carrier member to one another. In the carrier member, cut-outs are provided in the manner of a spiral or ring grooves, where the solder resides before the bonding takes place. Upon heating and liquifying of the solder, the target and carrier member are rotated such that the liquid solder moves out of the cut-outs by centrifugal forces to fill the gaps between target and carrier member and form solder bridges, but not at the height of the cut-outs. The solution given to the stress problem in this patent application is still rather complex.

In view of the above cited delamination problem, there is need for a more simple and reliable bonding system.

SUMMARY

Viewed from a first aspect, the present invention can provide a target assembly comprising a backing or support body having a carrying surface, and a sputtering target having a back surface or attaching surface, said carrying surface facing said back surface, thereby defining an intermediate space carrying a bonding material binding said back surface to said carrying surface, characterized in that distinct areas of either one or both of said back surface and said carrying surface are selectively, superficially treated so as to enhance the bonding strength of said bonding material in said distinct areas.

In another aspect of the invention, a target assembly comprises a support body having a carrying surface; a sputtering target having an attaching surface, said carrying surface and said attaching surface being arranged in opposing facing relation to one another, thereby defining an intermediate space between said carrying surface and said attaching surface; and a bonding material disposed in the intermediate space for binding said attaching surface to said carrying surface, wherein distinct areas of one or both of said attaching surface and said carrying surface are selectively, superficially treated to enhance the bonding strength of said bonding material in said distinct areas.

In an embodiment of this aspect, said bonding material is introduced into said intermediate space in liquid form. In another embodiment, treating the distinct areas comprises enhancing the wetting characteristics of said distinct areas such that the bonding material adheres strongly thereto. In an additional embodiment, the support body and the sputtering target are cylindrical in shape and are concentrically arranged with respect to one another.

In a further embodiment, the support body has an external diameter D1 and the sputtering target has an internal diameter D2 such that the intermediate space has a thickness $D=(D2-D1)/2$ (evidently D>0). The bonding material may comprise a low melting point solder. The low melting point solder may be indium.

In an additional embodiment, treatment of the distinct areas comprises atmospheric or low pressure vacuum plasma treatment, Corona treatment, grinding, sand-blasting, or CO2 ice-blasting. In another embodiment, treatment of the distinct areas comprises applying a metal layer by plasma spraying, sputtering through a mask or high energy assisted soldering. In a particular embodiment, said metal layer comprises said low melting point solder described above. High energy assisted soldering may comprise ultrasonic soldering. In another embodiment, treatment of the distinct areas comprises exerting mechanical friction such as brushing or rubbing.

In a further embodiment, the distinct areas comprise between 33 and 95% of the total surface of either one or both of said attaching surface and said carrying surface.

In another embodiment, the distinct areas are present on both said attaching surface and said carrying surface. In this embodiment, at least a portion of said distinct areas on said attaching surface and said distinct areas on said carrying surface are not aligned with one another. In embodiments, the support body may have a higher coefficient of thermal expansion (CTE) than said sputtering target.

In another aspect of the invention, a method for controlling delamination of a bonding material in a target assembly, the target assembly comprising a support body having a carrying surface, a sputtering target having an attaching surface, said carrying surface and said attaching surface arranged in opposing facing relation to one another, thereby defining an intermediate space between said carrying surface and said attaching surface, the bonding material for binding said attaching surface to said carrying surface being disposed in the intermediate space, the method comprises selectively, superficially treating distinct areas of one or both of said attaching surface and said carrying surface to enhance the bonding strength of the bonding material in said distinct areas thereby controlling delamination of the bonding material during solidification of the bonding material and/or sputtering of the target.

In an embodiment, treating the distinct areas comprises enhancing the wetting characteristics of said distinct areas such that the bonding material adheres strongly thereto. In another embodiment, treating the distinct areas comprises atmospheric or low pressure vacuum plasma treatment, Corona treatment, grinding, brushing, rubbing, sand-blasting, or $CO_2$ ice-blasting. In an additional embodiment, treating the distinct areas comprises applying a metal layer by plasma spraying, sputtering through a mask, or high energy assisted soldering. High energy assisted soldering may comprise ultrasonic soldering.

In another aspect of the invention, a method for controlling thermal stresses in a target assembly, the target assembly comprising a support body having a carrying surface, a sputtering target having an attaching surface, said carrying surface and said attaching surface arranged in opposing facing relation to one another, thereby defining an intermediate space between said carrying surface and said attaching surface, the bonding material for binding said attaching surface to said carrying surface being disposed in the intermediate space, the method comprises selectively, superficially treating distinct areas of one or both of said attaching surface and said carrying surface to enhance the bonding strength of the bonding material in said distinct areas thereby controlling thermal stresses in the interfaces between the sputtering target and the bonding material and the support body and the bonding material.

BRIEF INTRODUCTION TO THE DRAWINGS

FIG. 1a is a schematic representation illustrating the principle of bonding of cylinders (front view);

FIG. 1b is a schematic representation illustrating the principle of bonding of cylinders (top view);

Figure 4:
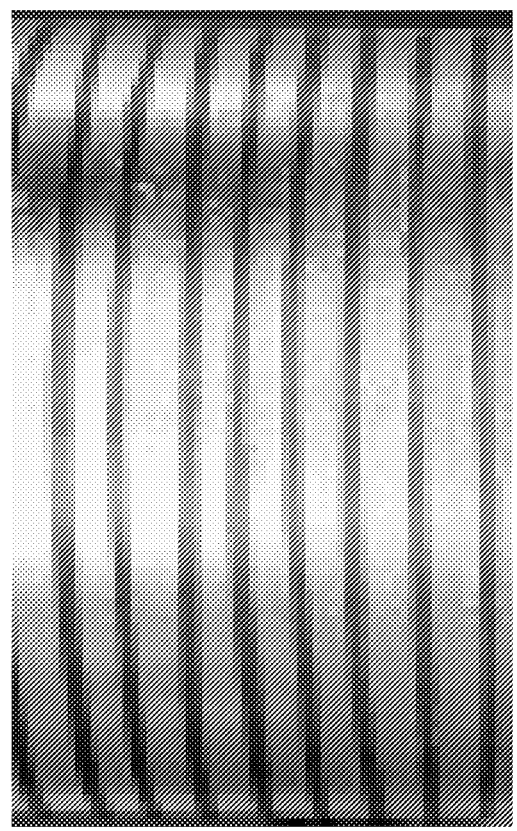

FIGS. 3a, b and c are schematic representations illustrating exemplary target assemblies in use during sputtering; and FIG. 4 is a front view schematic representation illustrating an exemplary arrangement of backing tube with wetting layer pattern.

DETAILED DESCRIPTION

The target assembly prevents delamination of the bonding material over large areas by controlling the stresses described above and by building in well chosen voids in the bonding layer during the final cooling down and the resulting bonding of the target/bonding layer/backing body assembly, using selective treatment of either the carrying surface of the support and/or the backside material of the target (segments). The selective treatment comprises a wetting or energizing process used to make the solder or bonding materials stick to the support materials and/or the target materials by changing the surface energy of one or both of those materials. One of ordinary skilled in the art will recognize that there are several ways to change the surface energy of the surface materials. Examples include, but are not limited to, atmospheric or low pressure vacuum plasma treatment (using an inert gas or a reactive gas), Corona treatment, mechanical pre-treatment of the surface by grinding, brushing, rubbing, sand-blasting or $CO_2$ ice-blasting, electrochemical deposition of a thin metal layer, depositing a thin metal layer by plasma spraying, sputtering through a mask, or a high energy assisted soldering technique, e.g. ultrasonic soldering. By selectively controlling the wetting process, distinct areas of good (strong) solder adherence can be defined, and consequently, also areas of bad (weak) solder adherence can be defined. The distinct areas may comprise between 33 and 95% of the total surface of either one or both of the back surface and the carrying surface.

In an example embodiment, the target assembly comprises a support body having a carrying surface and a sputtering target having an attaching surface. The carrying surface and the attaching surface are arranged in opposing facing relation to one another, thereby defining an intermediate space between the two surfaces. A bonding or solder material is introduced into the intermediate space for binding the attaching surface to the carrying surface. Before this however, distinct areas of one or both of the attaching surface and the carrying surface are selectively, superficially treated to enhance the bonding strength of the bonding material in the distinct areas. It is believed that the wetting characteristic of the bonding material is enhanced in the distinct areas. In an embodiment, the distinct areas of the attaching surface may not be facing or aligned with (i.e., may be offset from) the distinct areas of the carrying surface. Where the distinct areas are provided only on one of the attaching surface and the carrying surface, the other surface can be treated in the same way over its complete surface (non selective), so as to yield a full (continuous) wetting layer and an overall good wetting of the bonding material on that surface.

The bonding material may be introduced in the intermediate space in liquid form. The bonding material may be a low melting point solder, for example, indium.

The backing body or support may be cylindrical having an external diameter D1, and the external sputtering target may also be cylindrical having an internal diameter D2. The backing tube and target can be concentrically arranged thus defining the intermediate space as having a thickness $D=(D2-D1)/2$ (D evidently being >0).

The bonding strength of the solder or bonding material is enhanced in the areas that are wetted or energized. The selective wetting process results in a controlled delamination of the bonding material from the non-wetted surfaces during bonding, thus reducing and potentially alleviating thermal stresses created during the bonding process in a controlled manner. Controlled delamination during bonding reduces and potentially avoids uncontrolled delamination in the future. By controlling delamination, voids are purposely, selectively created in the bonding layer. Thus, alternate areas of good and bad adhesion are formed, resulting in an even distribution of heat transfer over the whole area of the target segment by means of thermally conductive solders or other bonding materials. As such, detrimental, local hot spots, which can result in excessively high stress and eventually cracking of the sputter target during the sputtering process, are avoided. By using the method of controlled wetting or delamination, one is able to bond the target segment material and the support material with minimal built-in stress, resulting in a bonded sputtering target that can withstand higher thermal loads compared to a sputtering target with an inhomogeneous and uncontrolled distribution of delaminated zones.

The target assembly described above is for example useful with rotary targets consisting of a backing tube and one or more cylindrical target segments, and for example for situations wherein the backing tube has a higher coefficient of thermal expansion (CTE) than the target segment. Such difference in CTE (or delta CTE) between the backing tube and the target segment may cause enough thermal stress in the system when cooling down from the temperature at which bonding is performed that uncontrolled delamination at any interface in the bonding system can arise.

Examples of target/backing tube assemblies are: Al:ZnO (Aluminum doped Zincoxide) on stainless steel, Silicon on stainless steel, Si:SiO$_2$ on stainless steel, ITO (Indium Tin Oxide) on stainless steel, AZO on aluminum, etc.

There are other ways to reduce the delta CTE. As an example, backing tubes with lower CTE are available, e.g. consisting of metals such as Ti and Mo. Tubes with lower CTE are much more expensive than the usual backing tube materials (e.g., stainless steel AlSl304, stainless steel AlSl316(L), Al6060, Cu). Choosing a backing tube manufactured of much more expensive materials would create a competitive disadvantage for the product.

An additional effect of the proposed method is that the required solder alloy volume per target can be reduced. Because the bonding metal (alloy) is an expensive material, a reduction in volume per target is advantageous. The proposed method results in a sputtering target having a cost advantage.

For rotary targets, the areal appearance of the non-continuous wetting zones can have various patterns such as dots, long or short strips, spirals in any directions (horizontal or perpendicular or diagonal).

The ratio of surface area of the non-wetted zone to the wetted zone depends on the coefficients of thermal expansion of the target and the supporting materials and the type of solders, and also on the temperature of target segments and supporting material at which the solder material is introduced and starts to cool. The temperature of both parts, target segments and supporting material, can be different depending on the selected heating and/or cooling techniques.

As described above, the structured, controlled wetting or metallisation results in controlled local bonding errors or voids (e.g. small delamination of solder from the backing tube or the target segments). Each local void will have a relatively small area in comparison with the equivalent area of the wetted or distinct areas without defects so that sufficient heat dissipation during sputtering is possible. Practically this can mean between 1/20 and 2/1 of void/wetted areas without defects, or expressed in mm it could be between 1 mm:20 mm to 10 mm:5 mm of void length or untreated area length:treated or wetted area length. In embodiments, voids may appear in a more or less regular pattern, alternated with well bonded, voidless areas with one local void having a certain distance to the next one. The voids form automatically during the cooling process after bonding (below the melting point of the solder) by the working of cohesion of solder and adhesion and shear forces at the interfaces.

The cooling of the assembly after bonding can be done either actively or naturally (both natural and controlled cooling can be applied), and when active either from the inside or from the outside or from both sides.

The target assembly will be described with reference to the Figures provided. It should be understood that the Figures are illustrative only and are in no way limiting to the scope of the invention.

FIGS. 1*a* & *b* illustrate the known principle of bonding a rotary target. A target segment (TS) is inserted over the backing tube (BT), whereafter solder or bonding material (BM) (molten indium or another low melting temperature alloy) is poured in the intermediate space between both tubes that are heated to (and possibly above) the bonding material's melting point. Thereafter, the target assembly is cooled down to room temperature.

Figure 2:
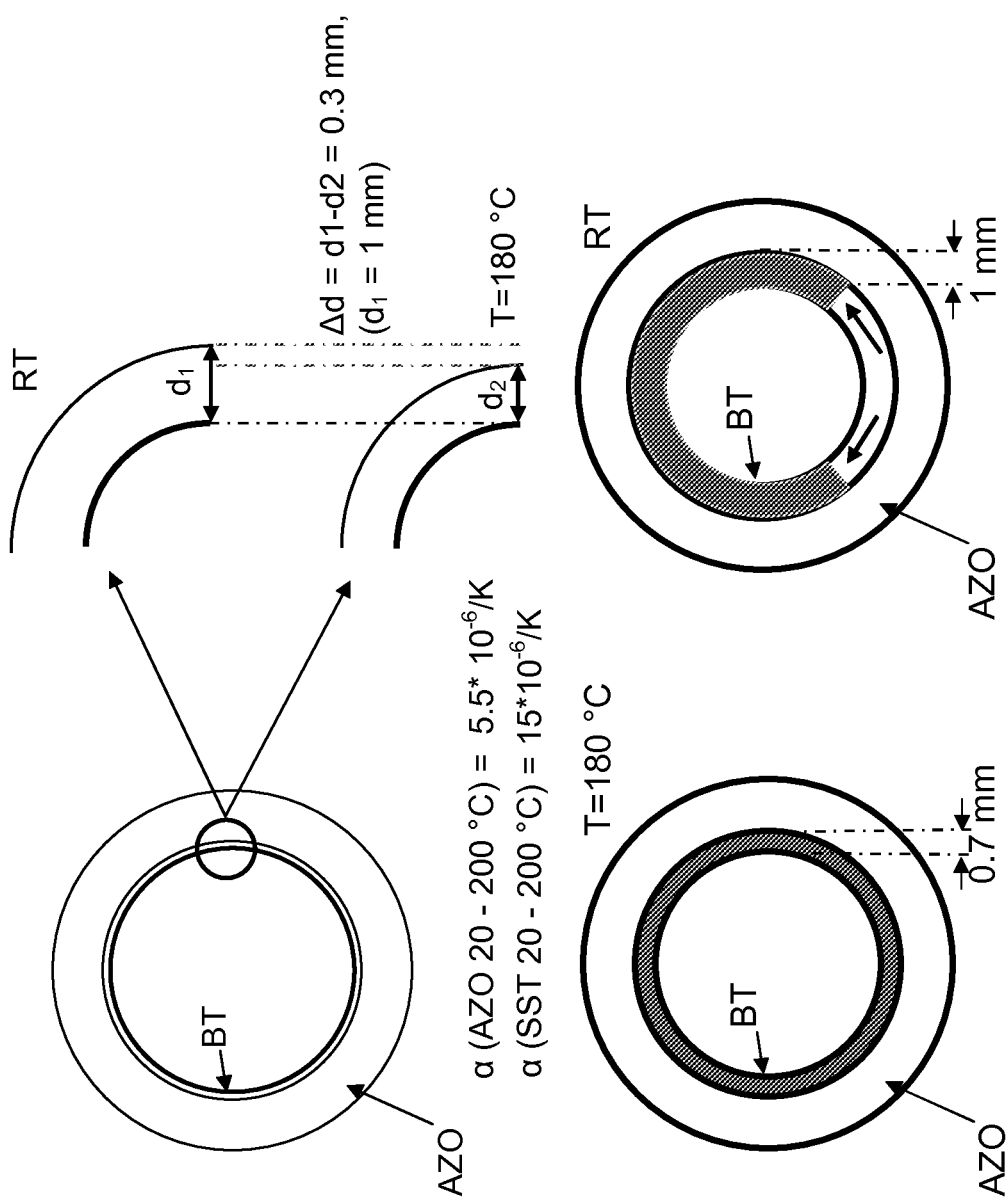
FIG. 2 is a top view schematic representation of a prior art target assembly showing a prior art delamination scheme.

FIG. 2 illustrates the principle of delamination of solder in the prior art. In the prior art example the coefficient of thermal expansion (CTE) of the supporting tube having the carrying surface is larger than that of the target segment having the back surface. An example target material to be sputtered is Al doped or Al$_2$O$_3$ doped ZnO (AZO) with a certain composition variation. A target segment has an outer diameter of 163 mm and an inner diameter of 135 mm. The outer target surface is mechanically ground to these dimension. The inner diameter can be achieved by mechanical grinding or in any other suitable manner such as chemical etching. The example Al:ZnO (AZO) target material has a CTE of ca. $5.5*10^{-6}$/K in a temperature range of 20° C. to 200° C. An example backing tube having a carrying surface is made of stainless steel. The backing tube has an outer diameter of 133 mm and an inner diameter of 125 mm. The outer surface can be mechanically lathed or ground. The example backing tube (e.g. stainless steel AlSl304) has a CTE of ca. $15*10^{-6}$/K in a temperature range of 20° C. to 200° C. When a rotary Al:ZnO(AZO) target is produced, the target/backing tube combination is heated to approx. 180° C. (in case that the solder material is indium), and solder or bonding material is poured in the annular intermediate space or bonding gap between the target and the Stainless Steel backing tube (SST). The annular space has a thickness of 0.3-1.5 mm (e.g. 0.7 mm) (see bottom left). However, whilst cooling down to room temperature (RT), the annular space or gap widens to 1 mm, because of the difference in CTE. This widening is illustrated at the top. The consequences are shown at the bottom right. During cooling, the volume shrinkage of the solder combined with the volume extension of the bond gap causes the weakest link (such as oxides or voids) to be broken in favour of the stronger bonding area.

In an example target assembly, contrary to the prior art, in order to obtain a guaranteed bonding strength between carrying surface and solder material as well as between back surface and solder material, both surfaces of the example in FIG. 2 can be treated beforehand by suitable energizing techniques.

In this example, the inner wall of the AZO target segments—in other words the back surface—is provided with a thin metal layer, which afterwards allows a good wetting of the binding material onto AZO ceramic surfaces. In one embodiment, the thin metal layer, further referred to as the "wetting material" is the same material as the solder material.

The wetting material can also be any other metallic alloy which has a good wetting property for solder material such as In or In alloys, Sn or Sn alloys, Ag or Ag alloys. Such alloys may include a certain amount of other metallic elements to improve the wetting property and bonding strength or to reduce the melting point or as a contamination. Ti, Zn, Cu, Ni, Ga, Ce, Bi, Sb, Si can be such elements. The wetting layer can be directly applied on the AZO back surface without any intermediate layer, or the wetting layer can be applied indirectly by using one or more intermediate layers which allow a stronger adhesion of the wetting layer to the AZO back surface. The intermediate layer can be any other metallic alloy which has good wetting properties for solder materials such as In or In alloys, Sn or Sn alloys, Ag or Ag alloys, Au or Au alloys. Such alloys may include a certain amount of other metallic elements to improve the wetting property and bonding strength or to reduce the melting point or as contamination. Ti, Zn, Cu, Ni, Ga, Ce, Bi, Sb, Si can be such elements.

The intermediate and/or the wetting layer on the back surface of the target segment can be applied by electrochemical deposition or ultrasonic treatment based on cavitation principle or sputter coating technique or mechanical brushing or heat treatment. The ultrasonic cavitation phenomenon is used to remove the oxidised layers on the surface to be wetted by the impact of an intense ultrasonic source generating micro-vibrations that cause a brushing effect. The back surface can be wetted either over its full surface area or only partially.

A direct patterning of the wetting layer on the back surface can be achieved via a selective wetting by using a mask for electrochemical deposition, heat treatment, sputter coating or mechanical brushing or ultrasonic treatment.

For selective ultrasonic wetting, the patterning can be achieved by discontinuous treatment of the ultrasonic equipment such as repetition of switch on and off, or different movement with variable feed rate of ultrasonic sonotrode. To achieve this, a well cleaned target segment is fixed in a horizontal position and rotated along its axis in a heating furnace. The furnace temperature is set to a temperature above the melting temperature of the wetting material. If the surface temperature is high enough to handle the liquid material, it is applied onto the rotating back surface. The liquid material is spread out by the use of mechanical means such as brushing. The material is kept liquid and the sonotrode is introduced into the inner space of the cylindrical target segment. During the rotation of the target segment in the furnace, the ultrasonic sonotrode is so positioned on the targets back surface that there is a slight contact between said back surface and the tip of the ultrasonic sonotrode. Hereby at least a few mm of the sonotrode tip is dipped in the liquid wetting material. The sonotrode tip moves forward from the front (the top or bottom of the target segment) towards the other end of the target segment or backward from the backside to the front with a certain progress rate such as by repetition of stop and go move, so that a ring type of wetting layers are formed by ultrasonic soldering. At certain selected positions the ultrasonic sonotrode treats the back surface without moving forward or backward whereby at least one circumferential ring shaped target surface area is wetted by wetting material. The sonotrode then moves further over a certain distance and the treatment mentioned above is repeated. The sonotrode can also move continuously with a defined progress rate so as to obtain a spiral type of pattern instead of a ring shaped pattern.

An alternative way to make a non-continuous wetting layer on the back surface of the target segment is to apply a pre-patterned intermediate layer, so that the sufficient adhesion of the wetting layer is guaranteed only for the pre-patterned area. The patterning of the intermediate layer can be realized by using a mask for electrochemical deposition or heat treatment or sputter coating. After pre-patterning of the intermediate layer, the target segment is rotated in a heating furnace. The furnace temperature is set to a temperature above the melting temperature of the wetting material. If the surface temperature is high enough to treat the wetting material, the wetting material is put onto the rotating back surface. The wetting material is spread out by means of mechanical tools such as brushing. The wetting layer including intermediate layer has typically a thickness of smaller than 0.1 mm.

In another example, in order to make a ring or spiral type of pattern of wetting layer on the carrying surface, being the outer surface of the backing tube, a well-cleaned backing tube which is machined to final dimensions is heated up to the temperature at which the wetting material is melted, and the temperature must be high enough to keep the wetting material in a liquid state during the surface treatment. Once the temperature mentioned above is reached, the backing tube starts to rotate and the ultrasonic sonotrode is applied to the wetting material. The ultrasonic wetting is concentrated on one position so as to form at least one (circumferential) ring-shaped adhesion layer on the carrying surface of the rotating backing tube. After the treatment of one ring-shaped wetting layer, the tip of the ultrasonic sonotrode moves to a next position whereby a certain distance between two ring-shaped wetting layers is kept over the whole length of the bonding area. Hereby non-continuous wetting layers, in other words, selective wetting layers are obtained by alternation of treatment and non-treatment of the carrying surface over the length of the bond area as shown in FIG. 4.

FIG. 4 shows the front view of part of the backing tube having a carrying surface, where it can be clearly seen that selective wetting layers (bright colour) are obtained on the outer surface of the backing tube in a ring shape manner by alternating ultrasonic treatment of the surface.

The selective wetting can also be applied in a spiral shape. In that case, the ultrasonic sonotrode moves continuously with a defined progress rate over the rotating backing tube, so that the non-fully wetted carrying surface is obtained. The selective wetting can also be prepared by electrochemical deposition or sputter coating or thermal spraying or sand blasting whereby a mask is used to create the non continuous pattern of wetting layer.

After the selective wetting is finished, and as illustrated in FIG. 1a&b, the target segment having a back surface with either a full (continuous) or partial (non-continuous) wetting layer is positioned concentrically outside the surface of the backing tube having a carrying surface with either full (continuous) or partial (non-continuous) wetting layer. The bottom part of the bonding gap is sealed by high temperature sealing material. Both parts—target segment and backing tube—are heated above the melting point of the solder material such as In or In alloys, Sn or Sn alloys, Ag or Ag alloys. Such alloys may include a certain amount of other metallic elements to improve wetting property and bonding strength or to reduce the melting point or as contamination. Ti, Zn, Cu, Ni, Ga, Ce, Bi, Sb, Si can be such elements.

When the surface temperature of the target segment reaches a sufficiently high temperature, typically 20-30° C. above the melting temperature of the solder material, the liquid solder is introduced into the bonding gap. Once the bonding gap is completely filled up with the molten solder, the heating is ceased and the target segment and backing tube and solder start to cool. Whilst cooling, the solder solidifies below its melting temperature and the bonding gap increases as illustrated above. As the solidified solder material cannot compensate for the increased bonding gap, the weakest link in the interface will break. This weakest binding spot in the interface between back surface and solder and/or carrying surface and solder, is located—as illustrated above—where the selective non-continuous wetting layer is absent. The predictable delamination or void formation can be localized in this narrow range, which leads to a minimal size of bonding error. This allows for a sufficient heat dissipation during the subsequent sputtering process.

FIG. 3a illustrates a cross section of part of an example arrangement of a rotary target assembly in use (in front view). During sputtering, the cooling of the backing tube is performed by water W flowing in it (left arrow), whilst the plasma P heats up the target (at the right). Heat, illustrated by the small black arrows, is dissipated during sputtering through the AZO layer and the indium solder bonding layer to the backing tube. In this example the contact areas of the backing tube-solder and AZO-solder are offset or not located at corresponding heights. By the presence of finely-distributed small voids instead of large delaminated areas caused by the pre-defined wetting errors on both contact areas, a sufficient and controlled heat dissipation is obtained.

Figure 3C:
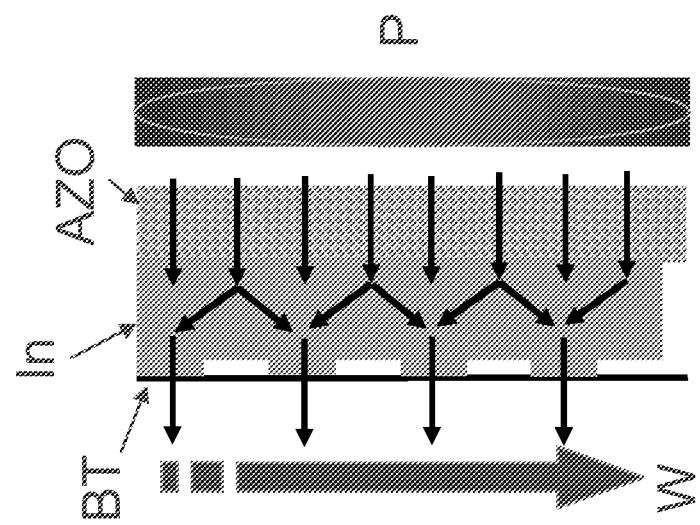

FIG. 3b illustrates an example arrangement where only the back surface of the target segment is treated so as to create the non-discontinuous wetting layer with sufficient adhesion (patterning of wetting layer). FIG. 3c illustrates an example arrangement where only the carrying surface of the backing tube is treated so as to create the non-discontinuous wetting layer with sufficient adhesion.

The intermediate spaces between either back surface of target segment and bonding layer, bonding layer and carrying surface of backing tube, or both of them in FIGS. 3a to c illustrate either a void space or a partially delaminated space, or a weaker binding between solder and back surface or carrying surface.

An example of the use of an AZO target assembly treated as described above is illustrated hereafter. Such targets may be used in the thin film photovoltaic industry to deposit Al:ZnO front window contact layers in case of CIGS or thin film Si solar cells. For any ceramic target material, the market wants to maximize deposition rate in order to reduce manufacturing costs (i.e. coating costs) and increase productivity. This is only possible when high power loads on the targets can be used. Presently, allowable power loads on AZO rotary have been limited by bonding technology.

Typical DC power loads of 18-20 kW/m are obtained for standard AZO rotary dimensions, i.e. consisting of a stainless steel backing tube with an inner diameter of 125 mm and an AZO rotary cylinder having a diameter of 135 mm and a 14 mm wall thickness. Only one-piece, sprayed rotary AZO targets have been reported to sustain power loads above 25 kW/m, and up to even 32 kW/m. The latter targets have a limited Al:ZnO wall thickness (typically 9 mm only), and have a density of only approx. 90%. As such, they suffer from other disadvantages.

In one embodiment, corresponding to the illustration in FIG. 3c, the back surface of the AZO target is fully wetted with indium by applying the ultrasonic treatment as described before. The carrying surface of the backing tube is partially wetted so as to obtain a pattern as illustrated in FIG. 4 (with ring shaped selective wetting layers), where between 60 and 80% of the carrying surface is selectively wetted with an indium layer using the sonotrode method. The width of each wetting ring is between 6 and 20 mm, the width of each non-treated surface ring is between 2 and 6 mm. A DC power load of 27.27 kW/m is successfully handled on an AZO target after this selective wetting is applied, which is much higher than for bonded rotary AZO targets as produced with the state of the art technology.

The invention can also be described by the following clauses:

1. A target assembly comprising a backing body having a carrying surface, and a sputtering target having a back surface, said carrying surface facing said back surface, thereby defining an intermediate space carrying a bonding material binding said back surface to said carrying surface, characterized in that distinct areas of either one or both of said back surface and said carrying surface are superficially treated so as to enhance the bonding strength of said bonding material in said distinct areas.

2. A target assembly according to clause 1, characterized in that said bonding material is introduced in said intermediate space in liquid form, and that in said superficially treated areas the wetting characteristics of said bonding material are enhanced.

3. A target assembly according to clauses 1 or 2, characterized in that said target assembly comprises an internal cylindrical backing body having an external diameter D1, and an external sputtering target having an internal diameter D2, said backing tube and said target being concentric and defining said intermediate space having a thickness $D=(D2-D1)/2$.

4. A target assembly according to anyone of clauses 1 to 3, characterized in that said bonding material is a low melting point solder such as indium.

5. A target assembly according to anyone of clauses 1 to 4, characterized in that said superficially treated areas are obtained by either one of atmospheric or low pressure vacuum plasma treatment, Corona treatment, grinding, sand-blasting and $CO_2$ ice-blasting.

6. A target assembly according to anyone of clauses 1 to 5, characterized in that said superficially treated areas are obtained by applying a metal layer by either plasma spraying, sputtering through a mask or mechanical friction such as brushing or rubbing or high energy assisted soldering, such as ultrasonic soldering.

7. A target assembly according to anyone of clauses 1 to 6, characterized in that said distinct areas of each of said back surface and said carrying surface comprise between 33 and 95% of the total surface of either one or both of said back surface and said carrying surface.

8. A target assembly according to anyone of clauses 6 or 7, characterized in that said back surface is superficially treated by applying a metal layer by ultrasonic soldering whereby the distinct areas comprise between 90 and 100% of the total surface of said back surface, and in that said carrying surface is superficially treated by applying a metal layer by ultrasonic soldering whereby the distinct areas comprise between 60 and 80% of the total surface of said carrying surface.

9. A target assembly according to anyone of clauses 1 to 7, characterized in that both said back surface and said carrying surface are superficially treated, and that treated areas of both of said back surface and said carrying surface are not facing each other.

10. A target assembly according to anyone of clauses 1 to 9, characterized in that said backing body has a higher coefficient of thermal expansion (CTE) than said sputtering target.

11. A target assembly comprising:
a support body comprising a carrying surface;
a sputtering target comprising an attaching surface;
an intermediate space between the carrying surface and an attaching surface, wherein the intermediate space comprises a bonding material; and
selected and distinct areas of enhanced bonding strength on the carrying surface and/or the attaching surface.

12. The target assembly of claim 11, wherein the bonding material is introduced into the intermediate space in liquid form.

13. The target assembly of any one of claims 11-12, wherein the selected and distinct areas have enhanced the wetting characteristics such that the bonding material adheres to the selected and distinct areas.

14. The target assembly of claim 11, wherein the surface energy of the selected and distinct areas has been changed such that the bonding material adheres to the selected and distinct areas.

15. The target assembly of claim 11, wherein the support body and the sputtering target are cylindrical in shape and are concentrically arranged with respect to one another.

16. The target assembly of claim 15, wherein the support body has an external diameter D1 and the sputtering target has an internal diameter D2 such that the intermediate space has a thickness $D=(D2-D1)/2$.

17. The target assembly of claim 11, wherein the bonding material comprises a low melting point solder.

18. The target assembly of claim 17, wherein the low melting point solder is indium.

19. The target assembly of claim 11, wherein the selected and distinct areas have been treated by a method selected from the group consisting of atmospheric or low pressure vacuum plasma treatment, Corona treatment, grinding, brushing, rubbing, sand-blasting, and CO2 ice-blasting.

20. The target assembly of claim 17, wherein a metal layer has been applied to the selected and distinct areas by a method selected from the group consisting of plasma spraying, sputtering through a mask, and high energy assisted soldering, wherein the metal layer comprises the low melting point solder.

21. The target assembly of claim 20, wherein high energy assisted soldering comprises ultrasonic soldering.

22. The target assembly of claim 11, wherein the selected and distinct areas comprise either
between about 33 and about 95% of the total surface of the attaching surface, or between
about 33 and about 95% of the total surface of the carrying surface.

23. The target assembly of claim 11, wherein the selected and distinct areas are present on both
the attaching surface and the carrying surface, and wherein the distinct areas comprise between about 33 and about 95% of the total surface of the attaching surface and between
about 33 and about 95% of the total surface of the carrying surface.

24. The target assembly of claim 23, wherein at least a portion of the selected and distinct areas on the attaching surface and the selected and distinct areas on the carrying surface are not aligned with one another.

25. The target assembly of claim 11, wherein the support body has a higher coefficient of thermal expansion (CTE) than the sputtering target.

26. A method for controlling delamination of a bonding material in a target assembly, the method comprising:
forming an intermediate space between a carrying surface of a support body and an attachment surface of a sputtering target;
selectively treating distinct areas on the carrying surface, the attachment surface, and/or both, wherein the selective treatment enhances the bonding strength of a bonding material at the distinct areas;
introducing a bonding material into the intermediate space thereby binding the carrying surface and the attachment surface, wherein delamination of the bonding material on the carrying surface and the attachment surface is controlled by the selective treatment of the distinct areas.

27. The method of claim 26, wherein the bonding material is introduced into the intermediate space in liquid form.

28. The method of claim 26, wherein treating the distinct areas comprises enhancing the wetting characteristics of the distinct areas such that the bonding material adheres strongly to the distinct areas.

29. The method of claim 26, wherein the support body and the sputtering target are cylindrical in shape and are concentrically arranged with respect to one another.

30. The method of claim 29, wherein the support body has an external diameter D1 and the sputtering target has an internal diameter D2 such that the intermediate space has a thickness $D=(D2-D1)/2$.

31. The method of claim 26, wherein the bonding material comprises a low melting point solder.

32. The method of claim 31, wherein the low melting point solder is indium.

33. The method of claim 26, wherein treating the distinct areas comprises treating the sistinct areas by atmospheric or low pressure vacuum plasma treatment, Corona treatment, grinding, brushing, rubbing, sand-blasting, or CO2 ice-blasting.

34. The method of claim 31, wherein treating the distinct areas comprises applying a metal layer by plasma spraying, sputtering through a mask, or high energy assisted soldering, and wherein said metal layer comprises the low melting point solder.

35. The method of claim 34, wherein high energy assisted soldering comprises ultrasonic soldering.

36. The method of claim 26, wherein the distinct areas comprise between about 33 and about 95% of the total surface of either one or both of the attaching surface and the carrying surface.

37. The method of claim 26, wherein the distinct areas are present on both the attaching surface and the carrying surface.

38. The method of claim 37, wherein at least a portion of said distinct areas on the attaching surface and the distinct areas on the carrying surface are not aligned with one another.

39. The method of claim 26, wherein the support body has a higher coefficient of thermal expansion (CTE) than the sputtering target.

40. A method for controlling thermal stresses in a target assembly of claim 1, the method comprising:
Selectively and superficially treating distinct areas of one or both of the attaching surface and
the carrying surface to enhance the bonding strength of the bonding material at the distinct areas thereby controlling thermal stresses at the interfaces between the sputtering target and the bonding material and the support body and the bonding material.

41. The target assembly of claim 11, wherein the carrying surface and the attaching surface are facing each other.

42. The target assembly of claim 26, wherein the carrying surface and the attachment surface are facing each other.

43. A target that has been produced by the method according to claim 26, wherein the target only contains areas of delamination at the distinct areas.

44. A target assembly comprising:
a support body comprising a carrying surface;
a sputtering target comprising an attaching surface;
an intermediate space between the carrying surface and an attaching surface, wherein the intermediate space comprises a bonding material; and
a means of enhancing bonding strength at the distinct areas of the carrying surface and/or the attaching surface.

While specific embodiments and/or details of the invention have been shown and described above to illustrate the application of the principles of the invention, it is understood that this invention may be embodied as more fully described in the claims, or as otherwise known by those skilled in the art (including any and all equivalents), without departing from such principles.

The invention claimed is:

1. A target assembly comprising
a support body having a carrying surface;
a sputtering target having an attaching surface, said carrying surface and said attaching surface being arranged in opposing facing relation to one another, thereby defining an intermediate space between said carrying surface and said attaching surface; and
a bonding material disposed in the intermediate space for binding said attaching surface to said carrying surface,
wherein distinct areas of one or both of said attaching surface and said carrying surface are selectively, superficially treated to control delamination of the bonding material and thereby enhance the bonding strength of said bonding material in said distinct areas, and
wherein a strategic void pattern is formed in combination with the enhanced bonding strength areas selectively provided in said distinct areas.

2. The target assembly of claim 1, wherein said bonding material is introduced into said intermediate space in liquid form.

3. The target assembly of claim 1, wherein treating the distinct areas comprises enhancing the wetting characteristics of said distinct areas such that the bonding material adheres thereto.

4. The target assembly of claim 1, wherein treating the distinct areas comprises changing the surface energy of the distinct areas such that the bonding material adheres thereto.

5. The target assembly of claim 1, wherein the support body and the sputtering target are cylindrical in shape and are concentrically arranged with respect to one another.

6. The target assembly of claim 5, wherein the support body has an external diameter D1 and the sputtering target has an internal diameter D2 such that the intermediate space has a thickness D=(D2−D1)/2.

7. The target assembly of claim 1, wherein said bonding material comprises a solder.

8. The target assembly of claim 7, wherein the solder comprises indium.

9. The target assembly of claim 1, wherein treatment of the distinct areas comprises atmospheric or vacuum plasma treatment, Corona treatment, grinding, brushing, rubbing, sand-blasting, or $CO_2$ ice-blasting.

10. The target assembly of claim 7, wherein treatment of the distinct areas comprises applying a metal layer by plasma spraying, sputtering through a mask, or energy assisted soldering.

11. The target assembly of claim 10, wherein the energy assisted soldering comprises ultrasonic soldering.

12. The target assembly of claim 1, wherein said distinct areas comprise either between 33 and 95% of the total surface of said attaching surface, or between 33 and 95% of the total surface of said carrying surface.

13. The target assembly of claim 1, wherein said distinct areas are present on both said attaching surface and said carrying surface, and said distinct areas comprise between 33 and 95% of the total surface of said attaching surface and between 33 and 95% of the total surface of said carrying surface.

14. The target assembly of claim 13, wherein at least a portion of said distinct areas on said attaching surface and said distinct areas on said carrying surface are not aligned with one another.

15. The target assembly of claim 1, wherein said support body has a higher coefficient of thermal expansion (CTE) than said sputtering target.

16. A method for controlling delamination of the bonding material in the target assembly of claim 1, wherein the method comprises selectively, superficially treating the distinct areas of one or both of said attaching surface and said carrying surface to enhance the bonding strength of the bonding material in said distinct areas thereby controlling delamination of the bonding material.

17. The method of claim 16, wherein treating said distinct areas comprises enhancing the wetting characteristics of said distinct areas such that the bonding material adheres strongly thereto.

18. The method of claim 16, wherein the support body and the sputtering target are cylindrical in shape and are concentrically arranged with respect to one another.

19. The method of claim 16, wherein treating said distinct areas comprises atmospheric or vacuum plasma treatment, Corona treatment, grinding, brushing, rubbing, sand-blasting, or $CO_2$ ice-blasting.

20. The method of claim 16, wherein treating said distinct areas comprises applying a metal layer by plasma spraying, sputtering through a mask, or energy assisted soldering.

21. The method of claim 16, wherein at least a portion of said distinct areas on said attaching surface and said distinct areas on said carrying surface are not aligned with one another.

22. The target assembly of claim 1, wherein the sputtering target is formed of a conductive oxide.

23. The target assembly of claim 1, wherein the sputtering target comprises a material selected from a group consisting of Aluminum doped Zinc Oxide (AZO); silicon Si:SiO2; or Indium Tin Oxide (ITO).

24. A target assembly comprising
a support body having a carrying surface;
a sputtering target having an attaching surface, said carrying surface and said attaching surface being arranged in opposing facing relation to one another, thereby defining an intermediate space between said carrying surface and said attaching surface; and
a bonding material disposed in the intermediate space for binding said attaching surface to said carrying surface,
wherein distinct areas of one or both of said attaching surface and said carrying surface are selectively, superficially treated to control delamination of the bonding material and thereby enhance the bonding strength of said bonding material in said distinct areas; and
wherein, under the controlled delamination, selectively positioned voids are arranged adjacent to the enhanced bonding strength areas provided in said distinct areas.

25. The target assembly of claim 24, wherein the selectively positioned voids and enhanced bonding strength areas are provided only on the sputtering target.

26. The target assembly of claim 1, wherein only the sputtering target is selectively, superficially treated to enhance bonding strength.

27. A target assembly comprising:
a support body having a carrying surface;
a sputtering target having an attaching surface, said carrying surface and said attaching surface being arranged in opposing facing relation to one another, thereby defining an intermediate space between carrying surface and said attaching surface; and a bonding material disposed in the intermediate space for bonding said attaching surface to said carrying surface, wherein distinct areas of one or both of said attaching surface and said carrying surface are selectively, superficially treated to enhance the bonding strength of said bonding material in said distinct areas, and to provide a selected arrangement of voids in regions external to said distinct areas with enhanced bonding strength, whereby there is achieved controlled delamination of the bonding material based on the combination of the selected arrangement of voids and enhanced bonding regions in said distinct areas.

28. The target assembly of claim 27, wherein the enhanced bonding strength of said bonding material in said distinct areas is based on enhanced wetting characteristics of said distinct, areas.

29. The target assembly of claim 10, wherein the applied metal layer is comprised of said solder.

30. The target assembly of claim 1, wherein the target is a rotary target.

31. The target assembly of claim 1 wherein the strategic void pattern formed by controlled delamination is formed adjacent to strength areas selectively provided in said distinct areas, which strength areas are based on a distinct area pattern selected from dots, strips or spirals.

32. The target assembly of claim 1 wherein the bonding material, which is disposed in the intermediate space between said carrying surface and said attaching surface, extends fully between the carrying and attaching surfaces in a region of maximum separation in the target assembly between said carrying surface and said attaching surface.

33. The target assembly of claim 32 wherein bonding material also extends fully between a maximum extension of voids formed by delamination and an adjacent most, opposing one of said carrying and attaching surfaces.

34. A target assembly comprising a support body having a carrying surface;

a sputtering target having an attaching surface, said carrying surface and said attaching surface being arranged in opposing facing relation to one another, thereby defining an intermediate space between said carrying surface and said attaching surface; and a bonding material disposed in the intermediate space for binding said attaching surface to said carrying surface, wherein distinct areas of one or both of said attaching surface and said carrying surface are selectively, superficially treated such that the distinct areas in the superficially treated surface or surfaces have a different surface energy than adjacent areas of the treated attaching surface and/or carrying surface, which leads to void formation at the adjacent areas and a controlled delamination of the bonding material which thereby enhances the bonding strength of said bonding material in said distinct areas.

* * * * *